United States Patent
Brillhart et al.

(10) Patent No.: US 9,842,753 B2
(45) Date of Patent: Dec. 12, 2017

(54) ABSORBING LAMPHEAD FACE

(71) Applicant: Applied Materials, Inc., Santa Clara, CA (US)

(72) Inventors: Paul Brillhart, Pleasanton, CA (US); Joseph M. Ranish, San Jose, CA (US); Satheesh Kuppurao, San Jose, CA (US); Balasubramanian Ramachandran, Santa Clara, CA (US); Zuoming Zhu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 330 days.

(21) Appl. No.: 14/257,942

(22) Filed: Apr. 21, 2014

(65) Prior Publication Data
US 2014/0319120 A1 Oct. 30, 2014

Related U.S. Application Data

(60) Provisional application No. 61/816,444, filed on Apr. 26, 2013.

(51) Int. Cl.
| | |
|---|---|
| F26B 3/00 | (2006.01) |
| H01L 21/67 | (2006.01) |
| F27B 17/00 | (2006.01) |
| F27D 5/00 | (2006.01) |
| C23C 16/48 | (2006.01) |
| H05B 3/00 | (2006.01) |

(52) U.S. Cl.
CPC ...... *H01L 21/67115* (2013.01); *C23C 16/481* (2013.01); *F27B 17/0025* (2013.01); *F27D 5/0037* (2013.01); *H05B 3/0047* (2013.01)

(58) Field of Classification Search
CPC .................................... F26B 3/00; F26B 3/28
USPC ........ 219/411, 399, 390, 405; 392/408, 416; 118/724, 725; 438/795–799
See application file for complete search history.

(56) References Cited

U.S. PATENT DOCUMENTS

| | | | |
|---|---|---|---|
| 5,062,386 A * | 11/1991 | Christensen | ........ C23C 16/4411 118/715 |
| 6,022,412 A | 2/2000 | Vincenzo et al. | |
| 6,376,806 B2 * | 4/2002 | Yoo | .......................... C30B 31/12 219/118 |
| 7,049,612 B2 * | 5/2006 | Quach | ..................... H01J 37/20 250/389 |

(Continued)

*Primary Examiner* — Michael Laflame, Jr.
(74) *Attorney, Agent, or Firm* — Patterson + Sheridan LLP

(57) ABSTRACT

The embodiments described herein generally relate to a lamphead assembly with an absorbing upper surface in a thermal processing chamber. In one embodiment, a processing chamber includes an upper structure, a lower structure, a base ring connecting the upper structure to the lower structure, a substrate support disposed between the upper structure and the lower structure, a lower structure disposed below the substrate support, a lamphead positioned proximate to the lower structure with one or more fixed lamphead positions formed therein, the lamphead comprising a first surface proximate the lower structure and a second surface opposite the first surface, wherein the first surface comprises an absorptive coating and one or more lamp assemblies each comprising a radiation generating source and positioned in connection with the one or more fixed lamphead positions.

20 Claims, 2 Drawing Sheets

(56) References Cited

U.S. PATENT DOCUMENTS

| | | | |
|---|---|---|---|
| 7,612,491 B2* | 11/2009 | Ranish | H01K 1/46 313/318.08 |
| 8,781,308 B2* | 7/2014 | Harumoto | F27B 17/0025 118/724 |
| 2002/0150395 A1* | 10/2002 | Shimizu | C23C 16/481 392/418 |
| 2003/0020027 A1 | 1/2003 | Danvers | |
| 2003/0222072 A1* | 12/2003 | Leavitt | H01L 21/67115 219/390 |
| 2006/0291834 A1 | 12/2006 | Hauf et al. | |
| 2007/0077355 A1 | 4/2007 | Chacin et al. | |
| 2008/0226272 A1* | 9/2008 | Kasai | H01L 21/2686 392/418 |
| 2009/0217875 A1* | 9/2009 | Dietl | H01L 21/67115 118/725 |
| 2010/0008656 A1* | 1/2010 | Sorabji | C23C 16/4404 392/416 |
| 2010/0111511 A1* | 5/2010 | Merry | C23C 16/481 392/411 |
| 2012/0237695 A1 | 9/2012 | Pye et al. | |

* cited by examiner

ABSORBING LAMPHEAD FACE

CROSS-REFERENCE TO RELATED APPLICATIONS

This application claims benefit of U.S. Provisional Patent Application Ser. No. 61/816,444, filed Apr. 26, 2013, which is incorporated herein by reference.

BACKGROUND OF THE INVENTION

Field of the Invention

Embodiments disclosed herein generally relate to lampheads for use in thermal processing chambers.

Description of the Related Art

Rapid thermal processing (RTP) and epitaxial deposition (epi) systems are employed in semiconductor chip fabrication to create, chemically alter or etch surface structures on semiconductor wafers. RTP and epi systems typically depend upon an array of high-intensity incandescent lamps fit into a lamphead and directed at the substrate or wafer. The lamps are electrically powered and can be very quickly turned off and on and a substantial fraction of their radiation can be directed to the substrate. As a result, the wafer can be very quickly heated without substantially heating the chamber and can be nearly as quickly cooled once the power is removed from the lamps.

A number of infrared lamps are located in the lamphead. During processing, radiation from the lamps radiates through an upper window, light passageways and a lower window onto a rotating semiconductor substrate in the processing chamber. In this manner, the wafer is heated to a required processing temperature. The lamphead may include a number of light pipes to deliver radiation from tungsten-halogen lamps to the processing chamber. The lamps are divided into multiple zones, which are located in a radially symmetrical manner. Each zone is separately powered by a lamp driver that is, in turn, controlled by a multi-input, multi-output controller. The lamps are connected to the lamp drivers through a large wiring collar and heavy-duty electrical cabling.

While reflective surfaces are the norm for retaining and focusing thermal energy on the substrate, too many reflective surfaces will result in a slow chamber cooling. Slower chamber cooling leads to longer step change times and slower throughput numbers.

Thus, there is a need in the art for better control of cooldown after thermal processing.

SUMMARY OF THE INVENTION

The embodiments described herein generally relate to lampheads for use in thermal processing chambers. In one embodiment, a processing chamber, can include an upper structure, a lower structure, a base ring connecting the upper structure to the lower structure, a substrate support disposed between the upper structure and the lower structure, a lower structure disposed below the substrate support, a lamphead positioned proximate to the lower structure with one or more fixed lamp positions formed therein, the lamphead comprising a first surface proximate the lower structure and a second surface opposite the first surface, wherein the first surface comprises an absorptive coating and one or more lamp assemblies each comprising a radiation generating source and positioned in connection with the one or more fixed lamp positions.

In another embodiment, a processing chamber for heating a substrate can include a processing chamber, a substrate support disposed within the process chamber for supporting a substrate, a lower structure disposed below the substrate support, a lamphead positioned proximate to the lower structure with one or more fixed lamp positions formed therein, the lamphead comprising a first surface proximate the lower structure and a second surface opposite the first surface, wherein the first surface comprises an absorptive coating and a lamp assembly comprising a radiation generating source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to semiconductor processing and more specifically to a radiance absorbing lamphead surface for use in an epi chamber or RTP chamber. Previous lampheads used a reflective surface to return radiation to the chamber. These reflective surfaces result in difficulty in cooldown as the radiation released during cooldown is returned to the chamber. By making the reflective surface of the lamphead radiance absorbing, radiation delivered during cooldown can be absorbed by the lamphead and thus more efficiently transferred from the processing chamber. The embodiments of the inventions disclosed herein are more clearly described with reference to the figures below.

Figure 1:
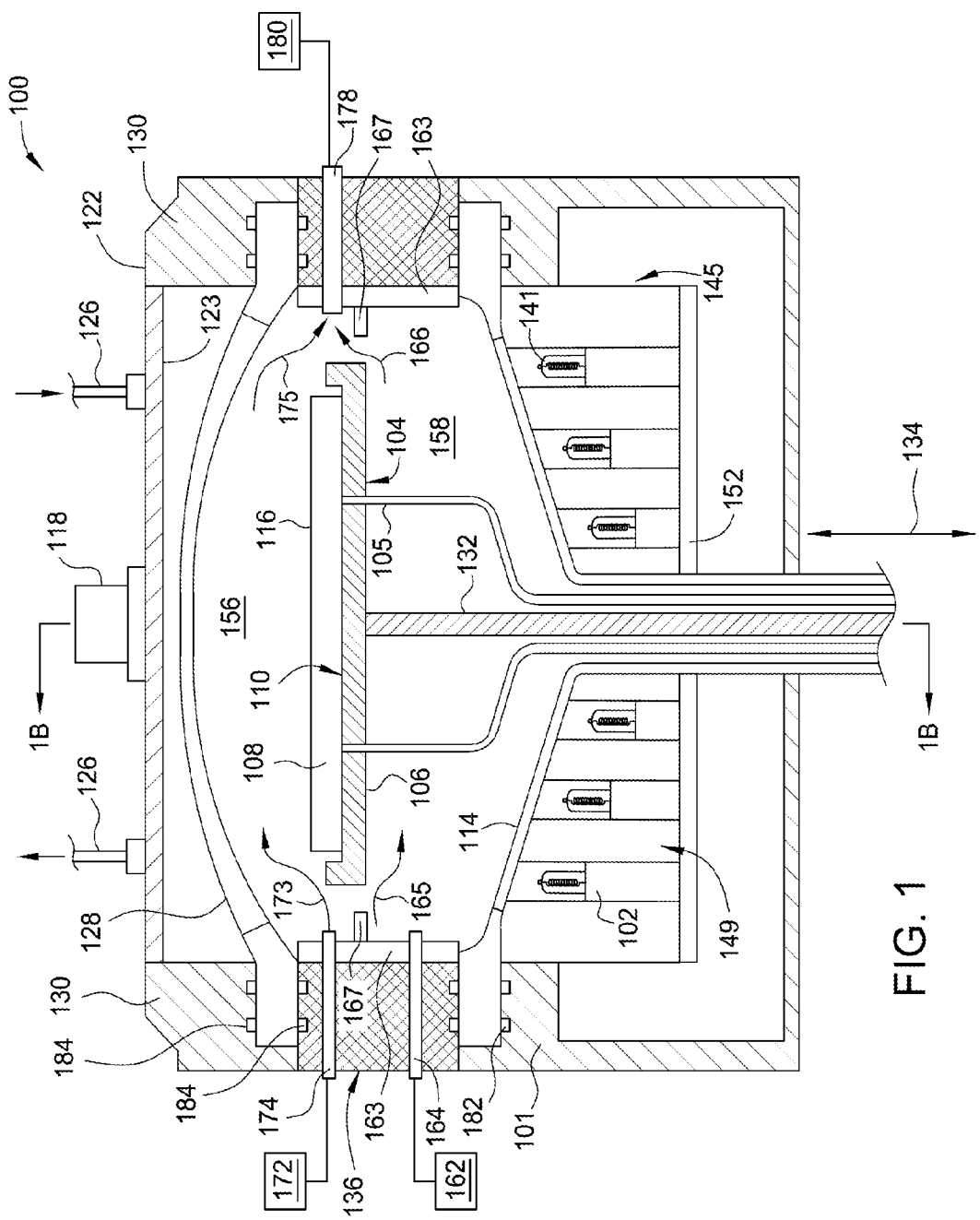
FIG. 1 illustrates a schematic sectional view of a backside heating process chamber according to one embodiment.

FIG. 1 illustrates a schematic sectional view of a backside heating processing chamber 100 according to one embodiment. The processing chamber 100 may be used to process one or more substrates, including the deposition of a material on an first surface of a substrate 108. The processing chamber 100 generally includes an array of lamp assemblies 102 for heating, among other components, a back side 104 of a substrate support 106 disposed within the processing chamber 100. The substrate support 106 may be a disk-like substrate support 106 as shown, or may be a ring-like substrate support (not shown), which supports the substrate from the edge of the substrate or may be a pin-type support which supports the substrate from the bottom by minimal contact posts or pins.

The substrate support 106 is located within the processing chamber 100 between an upper structure 128 and a lower structure 114. The upper structure 128 and the lower structure 114, along with a base ring 136 that is disposed between the upper structure 128 and lower structure 114, generally define an internal region of the processing chamber 100. The upper structure 128, the lower structure 114 or both may be dome shaped, flat, angled or other three dimensional shapes as needed by the user. In one embodiment, both the upper structure 128 and the lower structure 114 are domes. The substrate 108 (not to scale) can be brought into the processing chamber 100 and positioned onto the substrate support 106 through a loading port (not shown), which is obscured by the substrate support 106.

The base ring 136 generally includes the loading port, a process gas inlet 174, and a gas outlet 178. The base ring 136 may have a generally oblong shape with the long side on the loading port and the short sides on the process gas inlet 174 and the gas outlet 178, respectively. The base ring 136 may have any desired shape as long as the loading port, the process gas inlet 174 and the gas outlet 178 are angularly offset at about 90° with respect to each other and the loading port. For example, the loading port may be located at a side between the process gas inlet 174 and the gas outlet 178, with the process gas inlet 174 and the gas outlet 178 disposed at opposing ends of the base ring 136. In various embodiments, the loading port 103, the process gas inlet 174 and the gas outlet 178 are aligned to each other and disposed at substantially the same level.

The configuration of the process gas inlet 174 and gas outlet 178 enables a concentric process kit which greatly enhances in the annular shield's ability to contain light leakage which allows the pyrometry to be more accurate at temperatures below 500° C. The base ring 136 may include one or more coolant flow channels, disposed in proximity to O-rings 182, 184 for cooling of the base ring 136. The base ring 136 may also be shielded by liners of opaque quartz with the necessary cutouts (not shown).

The substrate support 106 is shown in an elevated processing position, but may be vertically traversed by an actuator (not shown) to a loading position below the processing position to allow lift pins 105 to contact the lower structure 114, passing through holes in the substrate support 106 and the central shaft 132, and raise the substrate 108 from the substrate support 106. A robot (not shown) may then enter the processing chamber 100 to engage and remove the substrate 108 therefrom though the loading port. The substrate support 106 then may be actuated up to the processing position to place the substrate 108, with its device side 116 facing up, on a front side 110 of the substrate support 106.

The substrate support 106, while located in the processing position, divides the internal volume of the processing chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the processing chamber 100 and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

In general, the central window portion of the upper structure 128 and the bottom of the lower structure 114 are formed from an optically transparent material such as quartz. The thickness and the degree of curvature of the upper structure 128 may be configured to provide a flatter geometry for uniform flow uniformity in the process chamber.

One or more lamps, such as an array of lamp assemblies 102, can be disposed adjacent to and beneath the lower structure 114 in a specified manner around the central shaft 132 to independently control the temperature at various regions of the substrate 108 as the process gas passes over, thereby facilitating the deposition of a material onto the first surface of the substrate 108. While not discussed here in detail, the deposited material may include silicon, doped silicon, germanium, doped germanium, silicon germanium, doped silicon germanium, gallium arsenide, gallium nitride, or aluminum gallium nitride.

The lamp assemblies 102 may include a heat generating element, depicted here as a lamp bulb 141, and be configured to heat the substrate 108 to a temperature within a range of about 200 degrees Celsius to about 1600 degrees Celsius. In further embodiments, the heat generating element can include non-incandescing solid radiators, such as an LED, or further radiation producing devices. Each lamp assembly 102 can be coupled to a power distribution board, such as printed circuit board (PCB) 152, through which power is supplied to each lamp assemblies 102. The lamp assemblies 102 are positioned within a lamphead 145 which may be cooled during or after processing by, for example, a cooling fluid introduced into channels 149 located between the lamp assemblies 102. The lamphead 145 can conductively and radiatively cool the lower structure 114 due in part to the close proximity of the lamphead 145 to the lower structure 114. The lamphead 145 may also cool the lamp walls and walls of the reflectors (not shown) around the lamps. Alternatively, the lower structure 104 may be cooled by a convective approach. Depending upon the application, the lamphead 145 may or may not be in contact with the lower structure 114. Further descriptions of the lamphead 145 are included below with respect to FIGS. 2A and 2B.

An annular shield 167 may be optionally disposed around the substrate support 106 and coupled to sidewall of the chamber body 101. The annular shield 167 prevents or minimizes leakage of heat/light noise from the lamps 102 to the device side 116 of the substrate 108 in addition to providing a pre-heat zone for the process gases. The annular shield 167 may be made from CVD SiC, sintered graphite coated with SiC, grown SiC, opaque quartz, coated quartz, or any similar, suitable material that is resistant to chemical breakdown by process and purging gases.

Conventionally, the substrate temperature is inferred from pyrometry measurements of the bottom of the substrate support using one or more pyrometers (not shown) viewing through ports in the lamphead 145. Pyrometry by this technique may require corrections to be made for reflected lamp radiation particularly at low substrate temperatures and a technique to infer the substrate temperature from the substrate support temperature. As a result of the annular shield 167, and backside only heating of the substrate 108 from the substrate support 106, one or more optical pyrometers, one shown as 118, can be used for temperature measurements/control of the substrate. The previously described temperature measurements are possible because the optical pyrometer 118 can only sense radiation from the hot substrate 108 with minimal background radiation from the lamps 102 directly reaching the optical pyrometer 118.

Figure 2A:
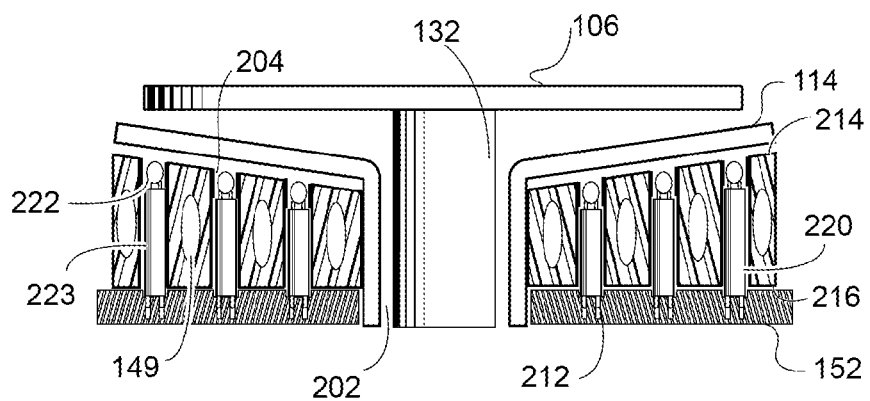
FIGS. 2A and 2B are schematic illustrations of the lamphead, according to one embodiment.

A reflector 122 may be optionally placed outside the upper structure 128 to reflect infrared light that is radiating off the substrate 108 back onto the substrate 108. The reflector 122 can have a reflective surface 123 facing the upper structure 128. The reflector 122 may be secured to the upper structure 128 using a clamp ring 130. The reflector 122 can be made of a metal such as aluminum or stainless steel. The efficiency of the reflection from the reflector 122 can be improved by coating at least a portion of the reflective surface 123 with a highly reflective coating such as with gold. The reflector 122 can have one or more machined channels 149, as shown in FIG. 2A. The channel 126 connects to a passage (not shown) formed on a side of the reflector 122. The passage is configured to carry a flow of a fluid such as water and may run horizontally along the side of the reflector 122 in any desired pattern covering a portion or entire surface of the reflector 122 for cooling the reflector 122. Upper structure 128 may also have a passage (not shown) formed between the reflector 122 and the upper structure 128. The passage can receive a fluid, such as a coolant, to cool the upper structure 128.

Process gas supplied from a process gas supply source 172 is introduced into the process gas region 156 through a process gas inlet 174 formed in the sidewall of the base ring 136. The process gas inlet 174 is configured to direct the process gas in a generally radially inward direction. During the film formation process, the substrate support 106 is located in the processing position, which is adjacent to and at about the same elevation as the process gas inlet 174, allowing the process gas to flow up and round along flow path 173 across the first surface of the substrate 108. The process gas exits the process gas region 156 (along flow path 175) through a gas outlet 178 located on the opposite side of the processing chamber 100 as the process gas inlet 174. Removal of the process gas through the gas outlet 178 may be facilitated by a vacuum pump 180 coupled thereto. As the process gas inlet 174 and the gas outlet 178 are aligned to each other and disposed approximately at the same elevation, it is believed that such a parallel arrangement, when combing with a flatter upper structure 128 (as will be discussed in detail below), will enable a generally planar, uniform gas flow across the substrate 108. Further radial uniformity may be provided by the rotation of the substrate 108 through the substrate support 106.

Purge gas supplied from a purge gas source 162 can be introduced to the purge gas region 158 through a purge gas inlet 164 formed in the sidewall of the base ring 136. The purge gas inlet 164 is disposed at an elevation below the process gas inlet 174. If the annular shield 167 is used, the annular shield 167 may be disposed between the process gas inlet 174 and the purge gas inlet 164. In either case, the purge gas inlet 164 is configured to direct the purge gas in a generally radially inward direction. If desired, the purge gas inlet 164 may be configured to direct the purge gas in an upward direction. During the film formation process, the substrate support 106 is located at a position such that the purge gas flows down and round along flow path 165 across back side 104 of the substrate support 106. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the substrate support 106). The purge gas exits the purge gas region 158 (along flow path 166) and is exhausted out of the process chamber through the gas outlet 178 located on the opposite side of the processing chamber 100 as the purge gas inlet 164.

Exemplary Lamphead

Figure 2B:
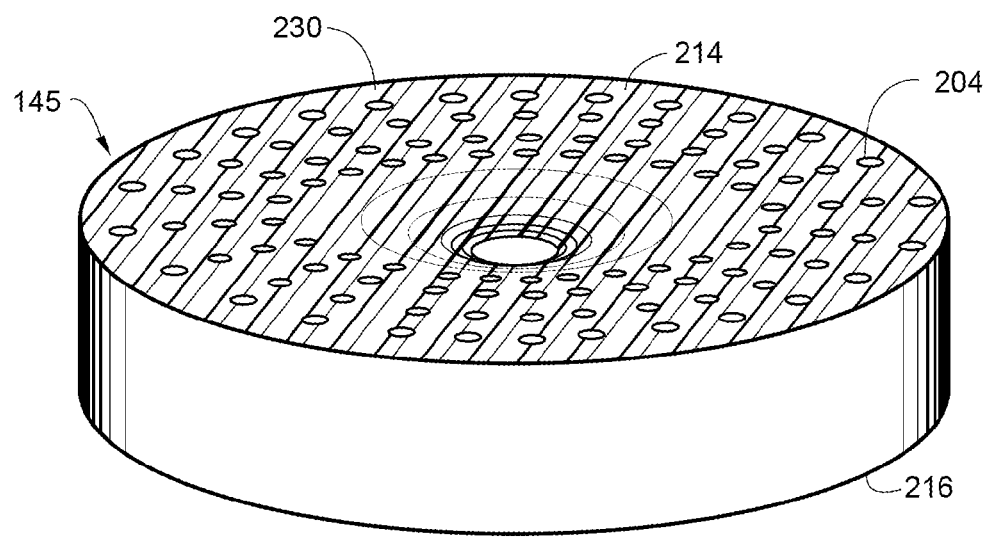

FIGS. 2A and 2B are schematic illustrations of the lamphead 145, according to one embodiment. FIG. 2A illustrates a cross-sectional view of a lower structure 114 with a lamphead 145 and a printed circuit board 152 according to one embodiment. As will be discussed below, the lamp assemblies 220 can be attached to a lamphead 145 which has an absorptive coating 230. The absorptive coating 230 can assist in heat dissipation from the chamber by absorbing radiation from one or more components of the chamber. The lamp assembly 220 and the lamphead 145 are part of the lamphead assembly, alongside other components such as a reflector (not shown). FIG. 2B illustrates overhead view of a lamphead 145 according to one embodiment. As previously described, the lower structure 114 can be formed in the shape of a generally circular, shallow martini glass or funnel with a central opening 202. The lamp assemblies 220 are disposed adjacent to and beneath the lower structure 114 in a specified, optimal desired manner around the central shaft (e.g., the central shaft 132 of FIG. 1). The lamp assemblies 220 act in conjunction with the lamphead 145 to independently control the temperature at various regions of the substrate.

FIG. 2A depicts the lower structure 114, the lamphead 145 and one or more lamp assemblies 220 in connection with a PCB 152. It will be clear to one skilled in the art that certain elements have been left out of the description for sake of clarity. The PCB 152 can be any standard circuit board designed to control the power distribution to the one or more lamp assemblies 220. The PCB 152 can further comprise one or more connection slots 212, shown here as six connection slots, for connection with the one or more lamp assemblies 220. Though shown here as six lamp assemblies 220, any number of lamp assemblies 220 can be incorporated with the embodiments described herein. Though the PCB 152 is depicted here as being flat, the PCB may be shaped according to the needs of the processing chamber. In one embodiment, the PCB board is positioned parallel to the lamphead 145.

Each of the one or more lamp assemblies 220 generally include a lamp bulb 222 and a lamp base 223. The lamp bulb 222 can be a lamp capable of heating and maintaining the substrate at a specified temperature, such as a halogen lamp, an infrared lamp and the like which are adapted as heating devices. Though described as including a bulb 222 and a lamp base 223, one or more embodiments can incorporate a radiation generating source in place of the bulb 222, the lamp base 223 or combinations thereof. A radiation generating source is any device capable of generating radiation for heating of the substrate, such as a bulb containing incandescing filament, a bulb containing radiating gas, or a solid state radiation source (e.g. an LED or a laser diode). One skilled in the art will understand that there are various combinations of radiation generating sources which can be used in lieu of or in combination with the bulb 222 or the lamp base 223 without diverging from the embodiments described herein.

The lower structure 114 can be comprised of a translucent material, such as quartz and can incorporate one or more elements described above with reference to lower structure 114, such as the funnel-like shape. The lower structure can be between 4 and 6 mm thick. The lamphead 145 can be positioned under and in close proximity to the lower structure 114. In one embodiment, the lamphead 145 is approximately 1 mm from the lower structure 114.

The lamphead 145 can have an first surface 214 and a second surface 216. The lamphead 145 can be monolithic. Further, the lamphead 145 can be composed of a conductive material, such as copper or aluminum. The lamphead 145 has a plurality of fixed lamp positions 204 which assure a specific position and orientation of the lamp bulb 222. The lamphead 145 can have as many as 400 or more fixed lamp positions 204. The fixed lamp positions 204 can be in a multiple concentric circle orientation or other alignments. The fixed lamp positions 204 can increase in depth as the holes extend from the inner radius to the outer radius. Stated another way, the thickness of the lamphead can be larger at the outer radius than the inner radius. The fixed lamp positions 204 can be bored holes in the lamphead 145. In one embodiment, the lamp bases 223 are held in a fixed orientation by the lamphead 145 and cooled by the lamphead 145.

The lamp assemblies 220 and the connection slots 212 are shown as a set of six, this number is not intended to be limiting. There can be more or fewer of each, as is needed to maintain proper substrate temperature. Further, it is important to understand that this is a side view of a three dimensional structure. As such, though the components appear to be positioned in a linear fashion, any position or combination of positions is possible. For example, on a circular PCB 152, the lamp assemblies 220 may be positioned at a 3 cm interval on both the X and Y axis, thus filling the circle. One skilled in the art will understand that there are numerous variations of this embodiment.

FIG. 2B depicts an overhead view of a lamphead 145 according to one embodiment. The lamphead 145 can have a conical shape. Further the shape of the lamphead 145 can substantially match the shape of the lower structure 114. The lamphead 145 has an first surface 214 and a second surface 216. The first surface is disposed in proximity to the lower structure 114. The second surface 216 is opposite the first surface 214. The first surface 214 can be substantially uniform.

The first surface 214 can further have one or more adhesion enhancing formations, such as microabrasion, an undercoating or a primer (not shown). The adhesion enhancing formations can enhance adhesion for layers deposited on the first surface 214. The first surface 214 or the lamphead 145 can be substantially parallel to the susceptor 106 or to the substrate 108.

The first surface 214 has an absorptive coating 230 disposed thereon. The absorptive coating 230 can be any coating which is capable of absorbing radiation. In one embodiment, the absorptive coating 230 is a carbon black paint or a composition including graphite. Examples of carbon black paint can include AEROGLAZE® Z306 polyurethane coating available from Lord Corporation located in Cary, N.C. Further examples include the 840 family of HiE-Coat™ high temperature coatings, including 840-C, 840-CM, 840-M coatings, available from Aremco Products, Inc. located in Valley Cottage, N.Y. Embodiments disclosed herein are not intended to be limiting of possible embodiments of the inventions disclosed herein.

The radiation absorbed by the absorptive coating 230 can be of a wavelength which is produced by the substrate or components in the process chamber, such as radiation with a wavelength of less than 4 microns. The absorptive coating 230 can be deposited by various techniques including painting, silk-screening, anodization, chemical vapor deposition (CVD), physical vapor deposition (PVD) or other deposition techniques. The absorptive coating 230 can selectively absorb wavelengths or can be absorbent to a wide variety of wavelengths. The absorptive coating 230 can be composed of one or more layers. In one embodiment, the absorptive coating 230 comprises between 1 and 6 layers of a carbon black paint.

The first surface 214 which receives the absorptive coating 230 generally includes the surfaces parallel to the lower structure 114, the susceptor 106, the substrate 108 or combinations thereof. Stated another way, the walls of the fixed lamp positions 204 are generally reflective. The absorptive coating can extend from the inner radius to the outer radius of the first surface 214, as depicted in FIG. 2B. The absorptive coating 230 can have a thickness which promotes absorption of the radiation from the chamber while allowing free transfer of heat with the lamphead 145. In one embodiment, the thickness of the absorptive coating 230 is at least 50 mils thick. Though depicted here as being uniformly deposited across the first surface 214, the absorptive coating 230 may have a variety of thicknesses across the first surface 214, such as an absorptive coating 230 which is thicker near the inner radius and becomes subsequently thinner toward the outer radius. In another embodiment, absorptive coating 230 is thinner near the inner radius of the first surface 214 and becomes subsequently thicker toward the outer radius.

In operation, the processing chamber 100 including the substrate 108 and the susceptor 106 are heated using the lamp assemblies 220 to reach an optimum temperature. When this is performed in a cyclic process, the processing chamber 100 must cool down relatively rapidly for precise heating and cooling. The components of the processing chamber 100, including the susceptor 106 and the substrate 108 will release radiation based on temperature. Some of this radiation, such as radiation with wavelengths of 4 microns or longer, will be absorbed by the lower structure 114. Radiation below 4 microns can then pass through the lower structure 114 and be received by the absorptive coating 230. By this means, the absorptive coating 230 can increase cooling in the processing chamber 100.

Without intending to be bound by theory, it is believed that the absorptive coating 230 can increase cooling in the processing chamber 100. As the components of the processing chamber 100 heat up, they release radiation. This radiation, as stated above, can be absorbed by other components of the processing chamber 100. This radiation can also be passed through the lower structure 114 to the lamphead 145. A reflective surface on the lamphead 145 will reflect the radiation received from the processing chamber 100 back through the lower structure 114 where it will either be absorbed by the lower structure 114 or received by other components of the processing chamber 100. By using the absorptive coating 230 instead of a reflective surface, the radiation is not returned to the processing chamber 100 and the processing chamber 100 can cool more effectively.

The lamphead 145 can be cooled using one or more cooling systems, such as the liquid cooling as delivered through the channels 149. In one embodiment, the lamphead 145 can be maintained at a temperature of 250 degrees Celsius or less, such as less than 200 degrees Celsius. The temperature of the lamphead is important to maintaining thermal transfer from the processing chamber 100 and through the lower structure 114.

In further embodiments, the reflector 122 can have an absorptive coating (not shown) formed on at least a portion of the reflective surface 123. It is believed that radiation from the lamp assemblies 220 can bypass the substrate 108 and the substrate support 106, thus being received by the reflector 122 and the optical pyrometers 118. The radiation from the lamp assemblies 220 thus can create error in the pyrometry reading for the substrate 108, also known as noise. By depositing an absorptive coating on at least a portion of the reflective surface 123 of the reflector 122, the radiation from the lamp assembly 220 received by the reflector 122 can be absorbed, rather than reflected. The absorption of the radiation at the reflector 122 is believed to reduce the noise received by the optical pyrometers 118.

Further, forming an absorptive coating on reflector 122 will enhance radiative loss and help achieve faster cooldown.

While the foregoing is directed to embodiments of the present invention, other and further embodiments of the invention may be devised without departing from the basic scope thereof, and the scope thereof is determined by the claims that follow.

The invention claimed is:

1. A processing chamber, comprising:
a first structure;
a second structure;
a base ring connecting the first structure to the second structure;
a substrate support disposed between the first structure and the second structure;
a radiation source structure positioned adjacent to the second structure with one or more radiation source positions formed in the radiation source structure, the radiation source structure comprising a first surface adjacent the second structure, wherein the first surface comprises an absorptive coating, wherein the second structure is disposed between the radiation source structure and the substrate support; and
one or more radiation sources located at the one or more radiation source positions.

2. The processing chamber of claim 1, wherein the absorptive coating is a carbon black coating.

3. The processing chamber of claim 1, wherein each of the radiation sources is a bulb containing an incandescent filament, a bulb containing radiating gas, or a solid state radiation source.

4. The processing chamber of claim 1, wherein the radiation source structure comprises copper or aluminum.

5. The processing chamber of claim 1, wherein the radiation source structure is water cooled.

6. The processing chamber of claim 1, wherein the radiation source structure has an adhesion-enhancing formation.

7. The processing chamber of claim 6, wherein the adhesion-enhancing formation is a primer.

8. The processing chamber of claim 1, further comprising:
a reflector with a reflective surface disposed above and facing the first structure, wherein the reflector has an absorptive coating disposed over at least a portion of the reflective surface.

9. The processing chamber of claim 1, wherein the first structure, the second structure or combinations thereof are dome shaped.

10. A processing chamber for heating a substrate, comprising:
a substrate support disposed within the process chamber for supporting a substrate, the substrate support having a first support surface for contacting a substrate and a second support surface opposite the first support surface;
a first structure disposed proximate the second support surface;
a radiation source structure positioned adjacent to the first structure with one or more radiation source positions formed therein, the radiation source structure comprising a first surface adjacent the first structure, the first surface comprising an absorptive coating, wherein the first structure is disposed between the radiation source structure and the substrate support;
a lamp assembly comprising a radiation generating source;
a first structure opposing the first structure; and
a base ring disposed between the first structure and the second structure, the second structure, the base ring and the first structure defining a processing region of the process chamber.

11. The processing chamber of claim 10, wherein the first structure, the second structure or combinations thereof are dome shaped.

12. The processing chamber of claim 10, wherein the absorptive coating is a carbon black coating.

13. The processing chamber of claim 10, wherein each of the radiation generating sources is a bulb containing an incandescent filament, a bulb containing radiating gas, or a solid state radiation source.

14. The processing chamber of claim 10, wherein the radiation source structure comprises copper or aluminum.

15. The processing chamber of claim 10, wherein the radiation source structure is water cooled.

16. The processing chamber of claim 10, wherein the radiation source structure has an adhesion-enhancing formation.

17. The processing chamber of claim 16, wherein the adhesion-enhancing formation is a primer.

18. The processing chamber of claim 10, further comprising a reflector with a reflective surface disposed proximate to and facing the second structure, wherein the reflector has an absorptive coating disposed over at least a portion of the reflective surface.

19. A processing chamber for heating a substrate, comprising:
a substrate support disposed within a processing region of the process chamber for supporting a substrate, the substrate support having a first support surface for contacting a substrate and a second support surface opposite the first support surface;
a first structure disposed proximate the second support surface;
a radiation source structure positioned outside of the processing region and adjacent to the first structure with one or more radiation source positions formed therein, the radiation source structure comprising a first surface adjacent the first structure, comprising:
an adhesion enhancing formation on or in the first surface; and
a carbon black absorptive coating formed on the adhesion enhancing formation;
a lamp assembly comprising a radiation generating source;
a second structure opposing the first structure; and
a base ring disposed between the first structure and the second structure, the second structure, the base ring and the first structure defining the processing region of the process chamber.

20. The processing chamber of claim 19, wherein each of the radiation generating sources is a bulb containing an incandescent filament, a bulb containing radiating gas, or a solid state radiation source.

* * * * *

UNITED STATES PATENT AND TRADEMARK OFFICE
CERTIFICATE OF CORRECTION

PATENT NO.        : 9,842,753 B2
APPLICATION NO.   : 14/257942
DATED             : December 12, 2017
INVENTOR(S)       : Paul Brillhart et al.

It is certified that error appears in the above-identified patent and that said Letters Patent is hereby corrected as shown below:

In Column 10, Line 5, in Claim 10, after "a" delete "first" and insert -- second --, therefor.

Signed and Sealed this
Twentieth Day of February, 2018

Andrei Iancu
*Director of the United States Patent and Trademark Office*